(12) United States Patent
Campbell et al.

(10) Patent No.: US 7,184,269 B2
(45) Date of Patent: Feb. 27, 2007

(54) COOLING APPARATUS AND METHOD FOR AN ELECTRONICS MODULE EMPLOYING AN INTEGRATED HEAT EXCHANGE ASSEMBLY

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US)

(73) Assignee: International Business Machines Company, Armonk, NY (US)

( * ) Notice: Subject to any disclaimer, the term of this patent is extended or adjusted under 35 U.S.C. 154(b) by 155 days.

(21) Appl. No.: 11/008,359

(22) Filed: Dec. 9, 2004

(65) Prior Publication Data

US 2006/0126296 A1 Jun. 15, 2006

(51) Int. Cl.
*H05K 7/20* (2006.01)

(52) U.S. Cl. .................. 361/700; 361/699; 361/715; 361/716; 361/719; 361/721; 174/15.1; 165/80.4; 165/104.33

(58) Field of Classification Search ............ None
See application file for complete search history.

(56) References Cited

U.S. PATENT DOCUMENTS

| | | | |
|---|---|---|---|
| 5,131,233 A | 7/1992 | Cray et al. ............ 62/64 |
| 5,515,910 A * | 5/1996 | Hamilton et al. ........ 165/263 |
| 5,924,482 A | 7/1999 | Edwards et al. ........ 165/104.33 |
| 6,019,165 A | 2/2000 | Batchelder ............. 165/80.3 |
| 6,408,937 B1 | 6/2002 | Roy ..................... 165/104.33 |
| 6,498,725 B2 | 12/2002 | Cole et al. ............ 361/700 |
| 6,587,345 B2 | 7/2003 | Chu et al. ............. 361/719 |
| 6,604,370 B2 | 8/2003 | Bash et al. ............ 62/171 |
| 6,604,571 B1 | 8/2003 | Morrow et al. ........ 165/104.21 |
| 6,625,023 B1 | 9/2003 | Morrow et al. ........ 361/700 |

(Continued)

OTHER PUBLICATIONS

"MEMS-Based Heat Exchanger Cools "Hot" CPUs," www.graniteve.com, Granite Ventures, LLC, Sep. 29, 2003 (3 pgs.).

(Continued)

*Primary Examiner*—Boris Chervinsky
(74) *Attorney, Agent, or Firm*—Lily Neff, Esq.; Kevin P. Radigan, Esq.; Heslin Rothenberg Farley & Mesiti P.C.

(57) ABSTRACT

A cooling apparatus for an electronics assembly having a substrate and one or more electronics devices includes an enclosure sealably engaging the substrate to form a cavity, with the electronics devices and a heat exchange assembly being disposed within the cavity. The heat exchange assembly defines a primary coolant flow path and a separate, secondary coolant flow path. The primary coolant flow path includes first and second chambers in fluid communication, and the secondary flow path includes a third chamber disposed between the first and second chambers. The heat exchange assembly provides a first thermal conduction path between primary coolant in the first chamber and secondary coolant in the third chamber, and a second thermal conduction path between primary coolant in the second chamber and secondary coolant in the third chamber. The heat exchange assembly further includes coolant nozzles to direct primary coolant towards the electronics devices.

33 Claims, 10 Drawing Sheets

U.S. PATENT DOCUMENTS

| | | | |
|---|---|---|---|
| 6,793,007 B1 * | 9/2004 | Kramer et al. | 165/80.4 |
| 6,828,675 B2 * | 12/2004 | Memory et al. | 257/714 |
| 6,995,980 B2 * | 2/2006 | Tustaniwskyj et al. | 361/699 |
| 7,000,691 B1 * | 2/2006 | Weber | 165/281 |
| 7,043,933 B1 * | 5/2006 | Knight | 62/259.2 |
| 2003/0072656 A1 | 4/2003 | Niwatsukino et al. | 417/354 |
| 2004/0012914 A1 | 1/2004 | Chu et al. | 361/679 |
| 2004/0123614 A1 | 7/2004 | Stewart | 62/259.2 |

OTHER PUBLICATIONS

Catalog, "Microstructure Liquid Cooler: Outstanding Cooling Performance for Electronic Devices," Atotech (2003) (6 pgs.).

Valenzuela, J.A., et al., "Cooling High Heat Flux Devices with *Mikros* Microchannel Heat Sinks," μikros Manufactuing, Inc., Aug. 2003 (13 pgs.).

Chu et al., "Thermal Dissipation Assembly and Fabrication Method for Electronics Drawer of a Multiple-Drawer Electronics Rack," U.S. Appl. No. 10/675,628, filed Sep. 30, 2003.

Chu et al., "Cooling System and Method Employing At Least Two Modular Cooling Units for Ensuring Cooling of Multiple Electronics Subsystems," U.S. Appl. No. 10/726,377, filed Dec. 13, 2003.

Chu et al., "Method, System and Program Product for Automatically Checking Coolant Loops of a Cooling System for a Computing Environment," U.S. Appl. No. 10/736,944, filed Dec. 16, 2003.

Chu et al., "Method, System and Program Product for Monitoring Rate of Volume Change of Coolant Within a Cooling System," U.S. Appl. No. 10/736,947, filed Dec. 16, 2003.

Campbell et al., "Cooling System and Method Employing Auxiliary Thermal Capacitor Unit for Facilitating Continuous Operation of an Electronics Rack," U.S. Appl. No. 10/930,079, filed Aug. 31, 2004.

* cited by examiner

COOLING APPARATUS AND METHOD FOR AN ELECTRONICS MODULE EMPLOYING AN INTEGRATED HEAT EXCHANGE ASSEMBLY

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Cooling System And Method Employing A Closed Loop Coolant Path And Micro-Scaled Cooling Structure Within An Electronics Subsystem Of An Electronics Rack," Campbell et al., Ser. No. 11/008,711;

"Cooling Apparatus For An Electronics Subsystem Employing A Coolant Flow Drive Apparatus Between Coolant Flow Paths," Campbell et al., Ser. No. 11/0008,732; and "Electronic Device Substrate Assembly With Multi-Layer Impermeable Barrier and Method of Making," Chu et al., Ser. No. 10/197,661, filed Jul. 17, 2002, and published as U.S. Publication No. US 2004/0812914 A1, on Jan. 22, 2004.

TECHNICAL FIELD

The present invention relates to cooling apparatuses and methods for removing heat generated by electronics devices, modules and systems, and to methods of constructing such cooling apparatuses. More particularly, the present invention relates to cooling apparatuses and methods for extracting heat from heat generating components of an electronics assembly such as an electronics module having a plurality of integrated circuit chips supported by a substrate.

BACKGROUND OF THE INVENTION

As is known, operating electronic devices produce heat. This heat should be removed from the devices in order to maintain device junction temperatures within desirable limits. Failure to remove the heat thus produced results in increased device temperatures, potentially leading to thermal runaway conditions. Several trends in the electronics industry have combined to increase the importance of thermal management, including heat removal for electronics devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it is no longer desirable to remove heat from modern devices solely by traditional air cooling methods, such as by using traditional air cooled heat sinks. These trends are likely to continue, furthering the need for alternatives to traditional air cooling methods.

One approach to avoiding the limitations of traditional air cooling is to use a cooling liquid. As is known, different liquids provide different cooling capabilities. In particular, liquids such as refrigerants or other dielectric fluids (e.g., fluorocarbon fluid) exhibit relatively poor thermal conductivity and specific heat properties, i.e., when compared to liquids such as water or other aqueous fluids. Dielectric liquids have an advantage, however, in that they may be placed in direct physical contact with electronic devices and interconnects without adverse affects such as corrosion or electrical short circuits. For example, U.S. Pat No. 6,052,284, entitled "Printed Circuit Board with Electronic Devices Mounted Thereon", describes an apparatus in which a dielectric liquid flows over and around several operating electronic devices, thereby removing heat from the devices. Similar approaches are disclosed in U.S. Pat. No. 5,655,290, entitled "Method for Making a Three-Dimensional Multichip Module" and U.S. Pat. No. 4,888,663, entitled "Cooling System for Electronic Assembly".

Other cooling liquids, such as water or other aqueous liquids, exhibit superior thermal conductivity and specific heat compared to dielectric liquids. Water-based coolants, however, must be kept from physical contact with electronic devices and interconnects, since corrosion and electrical short circuit problems are likely to result from such contact. Various methods have been disclosed for using water-based coolants, while providing physical separation between the coolant and the electronic devices. For example, U.S. Pat. No. 4,531,146, entitled "Apparatus for Cooling High-Density Integrated Circuit Packages", discloses the use of a conductive foil barrier; U.S. Pat. No. 4,879,629, entitled "Liquid Cooled Multi-chip Integrated Circuit Module Incorporating A Seamless Compliant Member for Leakproof Operation", and IBM Technical Disclosure Bulletin Vol. 20, No. 2, July 1977, entitled "Liquid Cooled Module with Compliant Membrane", disclose the use of a flexible barrier with thermal conduction enhancements (thermal studs and heatsinks, respectively); and U.S. Pat. No. 4,381,032, entitled "Apparatus for Cooling High-Density Integrated Circuit Packages", and U.S. Pat. No. 5,294,830, entitled "Apparatus for Indirect Impingement Cooling of Integrated Circuit Chips", disclose the use of flexible barriers, where pistons are used to maintain contact between the barrier and the devices to be cooled. The above-incorporated, co-pending patent application entitled "Electronic Device Substrate Assembly With Mulilayer Impermeable Barrier and Method of Making", describes an electronic device substrate assembly with a multilayer impermeable barrier which provides high effective thermal conductivity between a device to be cooled and a water-based coolant, while simultaneously maintaining physical separation between the coolant and electronic devices and minimizing mechanical stresses caused by mismatches in the thermal coefficients of expansion of various materials within the device assembly.

Notwithstanding the above, there remains a large and significant need to provide further useful cooling apparatus enhancements for facilitating cooling of electronic circuit devices such as electronic modules.

SUMMARY OF THE INVENTION

The shortcomings of the prior art are overcome and additional advantages are provided through a cooling apparatus for an electronics assembly comprising a substrate and at least one heat generating electronics device. The cooling apparatus includes: an enclosure having a perimeter region for sealably engaging the substrate to form a cavity, with the at least one heat generating electronics device being disposed within the cavity defined by the substrate and the enclosure; and a heat exchange assembly, also disposed within the enclosure. The heat exchange assembly and enclosure define a primary coolant flow path and a separate, secondary coolant flow path. The primary coolant flow path comprises a first chamber and a second chamber, and the first chamber and the second chamber are in fluid communication. The secondary coolant flow path includes a third chamber disposed between the first chamber and the second chamber of the primary coolant flow path. The heat exchange assembly provides a first thermal conduction path between primary coolant in the first chamber of the primary coolant flow path and secondary coolant in the third chamber of the secondary coolant flow path, and a second thermal conduction path between primary coolant in the second chamber of the primary coolant flow path and secondary coolant in the third chamber of the secondary coolant flow path. The heat exchange assembly further includes at least one coolant nozzle associated with the first chamber of the primary coolant flow path for directing primary coolant towards a surface of the at least one heat generating electronics device.

In another aspect, a cooled electronics module is provided. The cooled electronics module includes a substrate supporting at least one heat generating electronics device, and a cooling apparatus for cooling the at least one heat generating electronics device. The cooling apparatus includes an enclosure having a perimeter region for sealably engaging the substrate to form a cavity, with the at least one heat generating electronics device being disposed within the cavity defined by the substrate and the enclosure. The cooling apparatus further includes a heat exchange assembly disposed within the cavity. The heat exchange assembly defines a primary coolant flow path and a separate, secondary coolant flow path. The primary coolant flow path comprises a first chamber and a second chamber, with the first chamber and the second chamber being in fluid communication, and the secondary coolant flow path comprises a third chamber disposed between the first chamber and the second chamber of the primary coolant flow path. The heat exchange assembly provides a first thermal conduction path between primary coolant in the first chamber of the primary coolant flow path and secondary coolant in the third chamber of the secondary coolant flow path, and a second thermal conduction path between primary coolant in the second chamber of the primary coolant flow path and secondary coolant in the third chamber of the secondary coolant flow path. The heat exchange assembly further includes at least one coolant nozzle associated with the first chamber of the primary coolant flow path to direct primary coolant towards a surface of the at least one heat generating electronics device.

Methods of fabricating a cooling apparatus for an electronics assembly and for fabricating a cooled electronics module are also described and claimed.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronics subsystem" comprises any housing, compartment, drawer, blade, etc., containing one or more heat generating components of a computer system or other electronics system requiring cooling. The term "electronics rack" includes any frame, rack, blade server system, etc., having a heat generating component of a computer system or electronics system, and may be, for example, a stand alone computer processor having high, mid or low end processing capability. In one embodiment, an electronics rack may comprise multiple electronics subsystems, each having one or more heat generating components requiring cooling. Each heat generating component may comprise an electronics device, an electronics module, an integrated circuit chip, etc. As used herein, "micro-scaled cooling structure" means a cooling structure with a characteristic dimension of 200 micrometers (microns) or less.

One example of coolant within a cooling system in accordance with an aspect of the present invention is water. However, the concepts disclosed herein are readily adapted to use with other types of coolant on the facility side, system side, and conditioned coolant side of the cooling system. For example, one or more of the coolants may comprise a brine, a fluorocarbon liquid, a liquid metal, or other similar coolant, or a refrigerant, while still maintaining the advantages and unique features of the present invention.

As noted briefly above, power levels in computer equipment (primarily processors) are again rising to a level where they no longer can be simply air cooled. The components will likely be water cooled. Heat dissipated by the processor can be transferred to water via a water cooled cold plate. Facility water typically available at customer locations (i.e., data centers) is not suitable for use in these cold plates. First, condensation formation is a concern as the temperature of the data center water, ranging from 7° C. to 15° C., is far below the room dew point (typically 18–23° C.). Second, the relatively poor quality of the facility water (in chemistry, cleanliness, etc.) impacts system reliability. It is therefore desirable to utilize a water cooling/conditioning unit that circulates higher quality water to/from the electronics subsystems and rejects the heat to the data center water. As used herein, "facility water" or "facility coolant" refers to, in one example, this data center water or coolant, while "system coolant" refers to cooled/conditioned coolant circulating between a coolant distribution unit and the electronics subsystems to be cooled, and "conditioned coolant" refers to coolant circulating within a given electronics subsystem.

Figure 1:
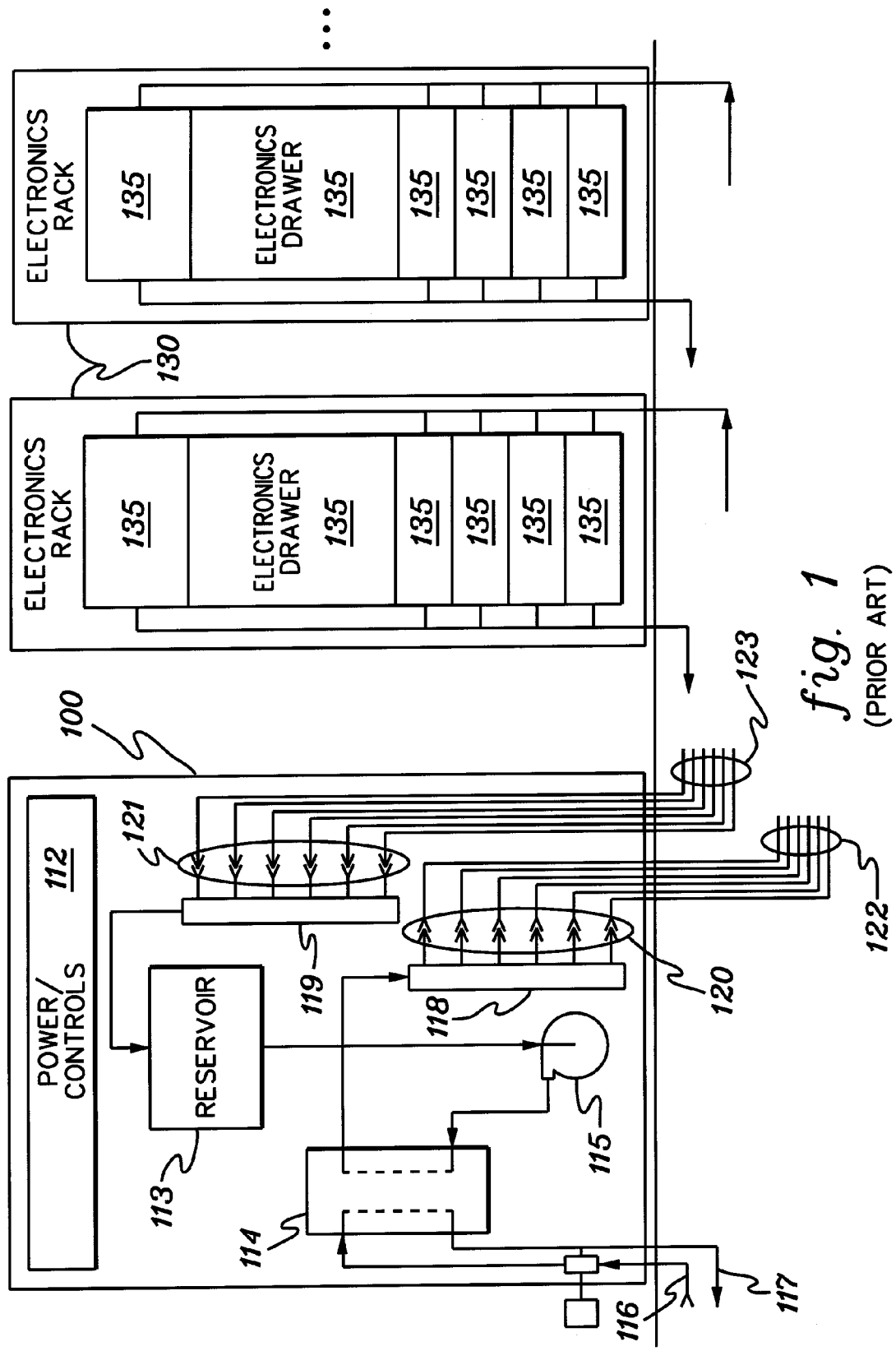
FIG. 1 is a conventional coolant distribution unit, such as a computer room water conditioning unit (CRWCU), for cooling one or more electronics racks of a computing environment.

Reference is now made to the drawings, wherein the same reference numbers used throughout different figures designate the same or similar components. FIG. 1 depicts one embodiment of a coolant distribution unit 100 for a computer room. The coolant distribution unit is conventionally a relatively large unit which occupies more than what would now be considered as two full electronics frames. Within the cooling unit 100 is a power/control element 112, a reservoir/expansion tank 113, a heat exchanger 114, a pump 115 (often accompanied by a redundant second pump), facility water (or site or customer service water or coolant) inlet 116 and outlet 117 supply pipes, a supply manifold 118 directing water to the electronics frames 130 via couplings 120 and lines 122, and a return manifold 119 directing water from the electronics frames 130, via lines 123 and couplings 121. Each electronics rack includes multiple electronics drawers or multiple electronics subsystems 135.

Figure 2:
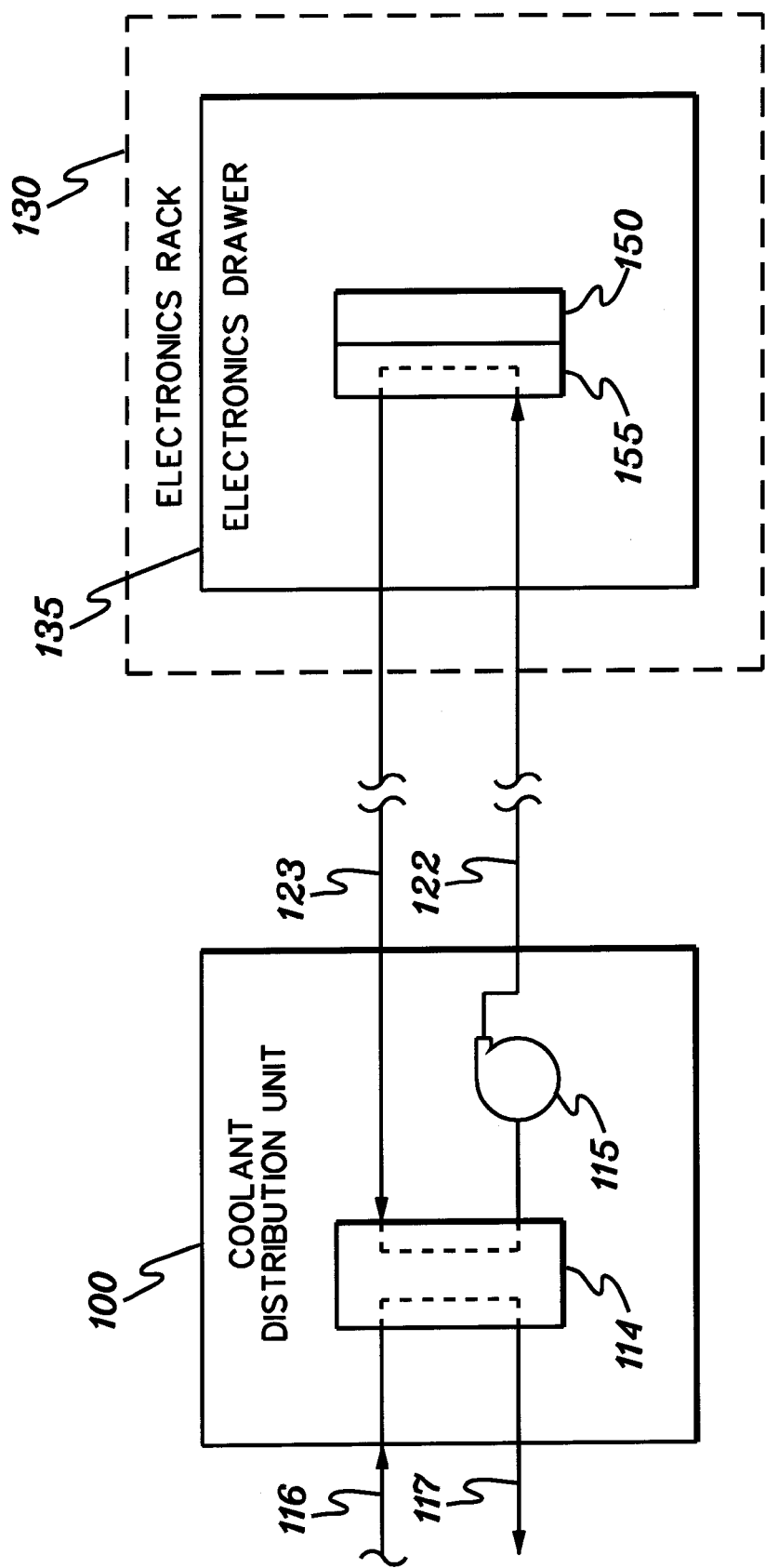
FIG. 2 is a schematic of one embodiment of an electronics drawer of an electronics rack and a cooling system therefore employing a conventional coolant distribution unit with a facility coolant loop and a system coolant loop.

FIG. 2 schematically illustrates operation of the cooling system of FIG. 1, wherein a liquid cooled cold plate 155 is shown coupled to an electronics module 150 of electronics drawer 135 within electronics rack 130. Heat is removed from electronics module 150 via the system coolant, which is pumped via pump 115 through cold plate 155 within the system coolant loop defined by heat exchanger 114 of coolant distribution unit 100, lines 122, 123 and cold plate 155. The system coolant loop and coolant distribution unit are designed to provide coolant of a controlled temperature and pressure, as well as controlled chemistry and cleanliness to the electronics. Furthermore, the system coolant is physically separate from the less controlled facility coolant in lines 116, 117 to which heat is ultimately transferred to. Filtration has not been required in a system such as depicted in FIG. 2 since the system coolant loop has characteristic dimensions for fluid flow that are sufficiently large to allow residual particulate debris to flow freely through the loop.

For example, a cold plate with 1.65 mm wide channels was employed in the ES/9000 system offered by International Business Machines Corporation of Armonk, N.Y.

As noted, processor power levels continue to rise as designers push for ever increasing computing performance. Electronic module power levels are expected to go well beyond conventional air cooling technologies, and even beyond conventional liquid cooling cold plate concepts. To address these future cooling needs, micro-scaled cooling structures are being developed. Two examples of such structures are marketed by Mikros Manufacturing, Inc., of Claremont, N.H., and ATOTECH of Berlin, Germany. Other examples of micro-scaled cooling structures are also available in the art. These micro-scaled structures have a characteristic dimension more than an order of magnitude less than the cold plates previously employed. Further, the micro-scaled cooling structures have a minimum dimension on the order of or smaller than particulates that regularly circulate through the system coolant of a cooling system such as depicted in FIGS. 1 & 2. In available structures, the characteristic dimension of micro-scaled structures currently ranges from 50 to 100 micrometers (microns), and could be further reduced as the technology matures. At these small width scales, fluid cleanliness is imperative. At such dimensions, the micro-scaled cooling structure could act more like a filter than a heat sink, thereby inhibiting cooling.

One solution to the problem would be to introduce a filter into the system coolant side of the cooling assembly of FIGS. 1 & 2. This, unfortunately, would be undesirable because it would add additional pressure drop and would require continuing maintenance. Thus, in one aspect, an objective of the present invention is to create an isolated subassembly associated with the electronics subsystem which is in thermal contact with the system coolant loop and which is designed and manufactured to accommodate the micro-scale aspects of a micro-scaled cooling structure.

Figure 3:
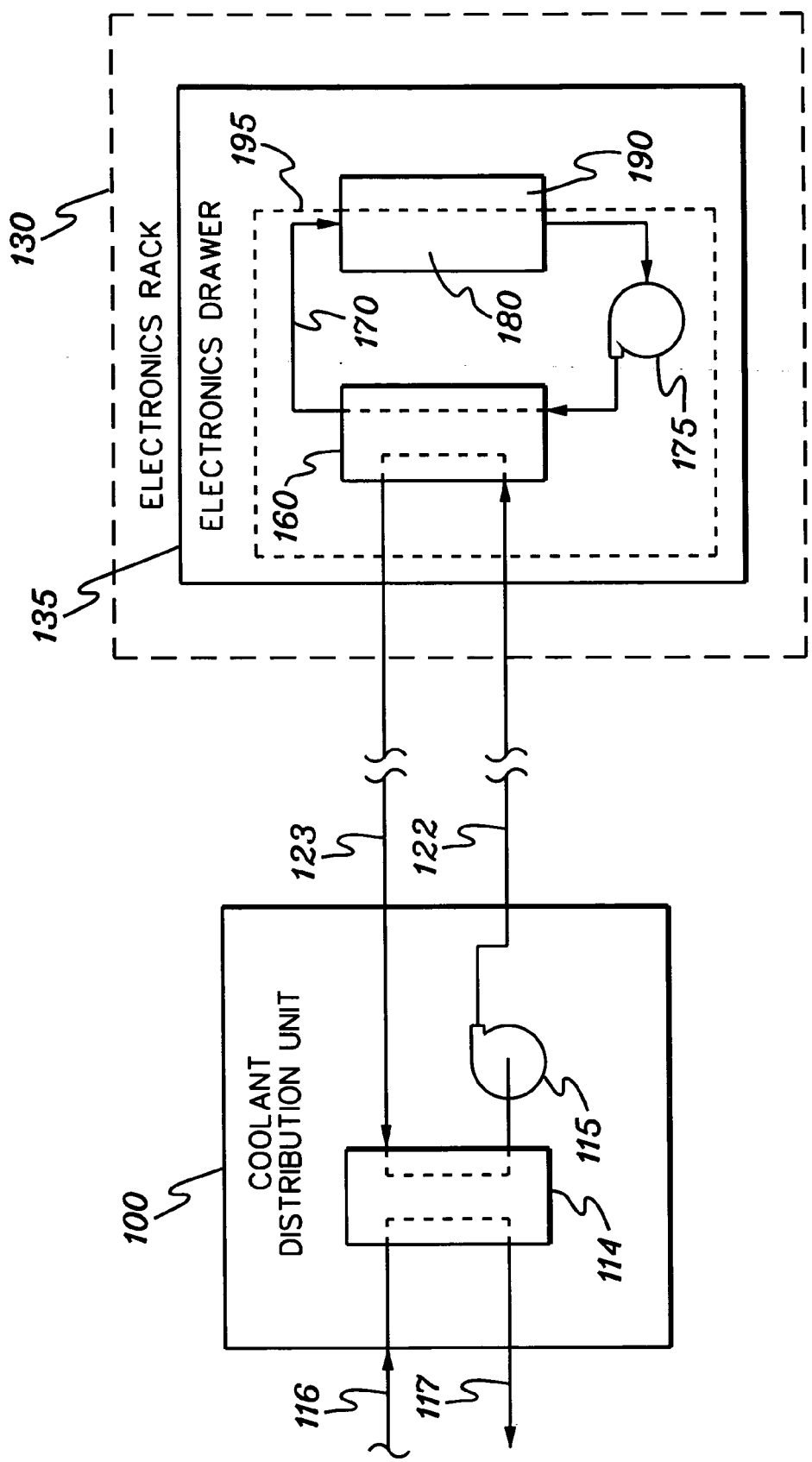
FIG. 3 is a schematic of one embodiment of a cooling system for an electronics subsystem of an electronics rack, which includes a coolant distribution unit and a thermal dissipation unit comprising a conditioned coolant loop within the electronics subsystem, in accordance with an aspect of the present invention.

FIG. 3 depicts one embodiment of a cooling system accomplishing this objective. This cooling system or apparatus includes a coolant distribution unit 100 and one or more thermal dissipation units 195. Each thermal dissipation unit 195 is associated with a respective electronics subsystem or drawer 135 of an electronics rack 130 of the computing environment. The coolant distribution unit 100 again includes a first heat exchanger 114, a first cooling loop 116, 117, and one or more second cooling loops 122, 123. The first cooling loop 116, 117 receives facility coolant and passes at least a portion thereof through the first heat exchanger 114. Each second cooling loop provides system coolant to at least one electronics subsystem 135 and expels heat in the first heat exchanger 114 from electronics subsystem 135 to the facility coolant in the first cooling loop 116, 117. System coolant is circulated within the second cooling loop 122, 123 via a pump 115.

Each thermal dissipation unit 195 is associated with a respective electronics subsystem 135, and includes a second heat exchanger 160, a second cooling loop 122, 123 of the one or more second cooling loops, a third cooling loop 170, and a micro-scaled cooling structure 180. The second cooling loop provides system coolant to the second heat exchanger 160, and the third cooling loop circulates conditioned coolant within the at least one electronics subsystem through the micro-scaled cooling structure 180 and expels heat in the second heat exchanger 160 from a heat generating component 190 (e.g., electronics module) of the electronics subsystem 135. The heat is expelled in the heat exchanger to the system coolant in the second cooling loop 122, 123. Conditioned coolant circulates via a pump 175 through the third cooling loop 170 of the thermal dissipation unit 195. One example of a suitable pump 175 is provided in the initially incorporated, commonly assigned, co-filed application entitled: "Cooling Apparatus For An Electronics Subsystem Employing A Coolant Flow Drive Apparatus Between Coolant Flow Paths". In one example, the third cooling loop is a closed loop fluid path, thereby minimizing the opportunity for particulate to enter the cooling loop once the conditioned coolant has been filtered as described below.

Advantageously, the third cooling loop is physically isolated from the system coolant of the cooling assembly. The third cooling loop is a separate, dedicated loop or subassembly localized to the electronics subsystem, and to, more particularly, the one or more heat generating components, such as an electronic module thereof, that is to be cooled. The third cooling loop and associated components comprise a subassembly that is manufactured to create a pristine environment from both a particulate and materials compatibility (i.e., corrosion) viewpoint. The cooling subassembly 195 is designed to be a closed system once operational (i.e., a system that is not opened in the field). Being a closed subsystem in the field, particulate contamination can be managed during assembly.

Those skilled in the art will note that provided herein is a cooling apparatus which employs, in one embodiment, three distinct cooling loops. A first cooling loop and a second cooling loop are associated with a coolant distribution unit which includes a fluid-to-fluid heat exchanger to allow the transfer of heat from system coolant within the second cooling loop to facility coolant within the first cooling loop. One or more thermal dissipation units or cooling subassemblies are associated with one or more electronics subsystems of, for example, an electronics rack. Each thermal dissipation unit includes a respective second cooling loop and a third cooling loop, which in one example, comprises an isolated, closed loop flow path. The thermal dissipation unit further includes a second fluid-to-fluid heat exchanger which allows heat to be expelled from conditioned coolant within the third cooling loop to the system coolant within the second cooling loop for transfer to the coolant distribution unit. Advantageously, by separating the conditioned coolant, system coolant and facility coolant, each coolant loop can have coolant of different properties or characteristics. These different characteristics can include different:

Coolant purity—which allows the use of higher purity coolant within the third cooling loop, less pure coolant within the system coolant loop, and still less pure coolant within the facility coolant loop. High purity coolant is desirable in the third cooling loop of the thermal dissipation unit, particularly when used with small-scale cooling structures (i.e., channels, nozzles, orifices, fins, etc.) to prevent contaminants from interfering with operation of, for example, a micro-scaled cooling structure.

Coolant pressure—which allows, for example, conditioned coolant within the third cooling loop to be at a pressure below atmospheric pressure, while system coolant and facility coolant in the second cooling loop and the first cooling loop remain at or above atmospheric pressure. This allows, for example, the conditioned coolant to have a different boiling point than the system coolant.

Coolant phase change—the third cooling loop allows a conditioned coolant to be employed in a two-phase cooling approach, while maintaining the system coolant and facility coolant as single-phase coolants.

Coolant flow rate—which may be related to different pressures and phase change temperatures of the various coolants in the cooling system.

Further, it may be desirable to employ a lower flow rate through the micro-scaled cooling structure than the flow rate through, for example, the second cooling loop containing the system coolant.

Coolant chemistry—which allows different coolant fluid chemistries to be employed in the various cooling loops of the cooling system. For example, water could be employed in the first and second cooling loops as both the facility coolant and the system coolant, only of different purity, while the third cooling loop may employ a dielectric as the conditioned coolant. This may be advantageous, for example, in an embodiment where the conditioned coolant directly contacts one or more integrated circuit chips of the electronics subsystem being cooled.

Various approaches to coupling a cooling structure to one or more heat generating components of an electronics assembly are described in the above-incorporated U.S. patent application entitled "Cooling System and Method Employing a Closed Loop Coolant Path and Micro-Scaled Cooling Structure Within an Electronic Subsystem of an Electronics Rack." Presented herein are various enhanced cooling apparatuses, wherein a heat exchange assembly of a cooling structure is integrated within an electronics module to be cooled.

As noted initially, various cooling apparatus designs employ indirect water cooling of electronic modules via cold plates. Further, various designs have also introduced the possibility of direct water cooling of electronic devices by isolating the underside of an electronic device, top surface metallurgy of the substrate, and passive components on the substrate, using a thermally conductive film such as described in the above-incorporated patent application entitled, "Electronic Device Substrate Assembly With Multi-Layer Impermeable Barrier and Method of Making." Because of the normal boiling point of water at atmospheric pressure, and the typical requirement to maintain integrated circuit chip temperatures below 100° C., one mode of cooling obtaining high heat transfer rates is to employ a single phase forced convection approach using jets of water impinging on a thermally conductive surface coupled to the integrated circuit chips. Even higher heat transfer rates can be achieved with a water spray that changes phase upon contacting a surface coupled to the integrated circuit chips. Thus, in one embodiment, disclosed herein is a module having an integrated cooling apparatus which employs a spray operating at a sub-atmospheric pressure to attain high heat transfer rates and maintain chip temperatures below, e.g., 100° C. Heat exchange surfaces for condensing vapor and for sub-cooling the liquid coolant are also incorporated into the cooling apparatus. In one embodiment, a miniature pump is employed as part of the cooling apparatus, making the complete apparatus a field replaceable unit.

In one aspect, a cooling apparatus in accordance with the present invention includes a heat exchange assembly which is disposed within an enclosure enclosing an electronics assembly. The enclosure has a perimeter region that sealably engages a substrate of the electronics assembly to form a cavity. At least one heat generating electronics device is disposed within the cavity defined by the substrate and the enclosure. A heat exchange assembly defines in combination with the enclosure and the substrate a primary coolant flow path (which comprises, e.g., a portion of the third cooling loop of FIG. 3 passing through the cooling structure) and a separate, secondary coolant flow path (which comprises, e.g., a portion of the second cooling loop of FIG. 3). In one embodiment, the primary coolant and the secondary coolant have one or more different coolant characteristics such as outlined above. Advantageously, the cooling apparatus is compact and provides heat removal from electronics devices such as integrated circuit chips employing, in one example, water as the primary coolant and rejects heat from the primary coolant to the secondary coolant in situ at the electronics module. In one embodiment, sub-atmospheric pressure may be maintained within at least a portion of the module housing to allow a water spray directly contacting a surface coupled to the integrated circuit chips to undergo a phase change, thereby obtaining a higher heat transfer rate. In an alternative embodiment, single-phase jet water impingement could be employed at a surface of, or a surface coupled to, the integrated circuit chips.

Figure 4:
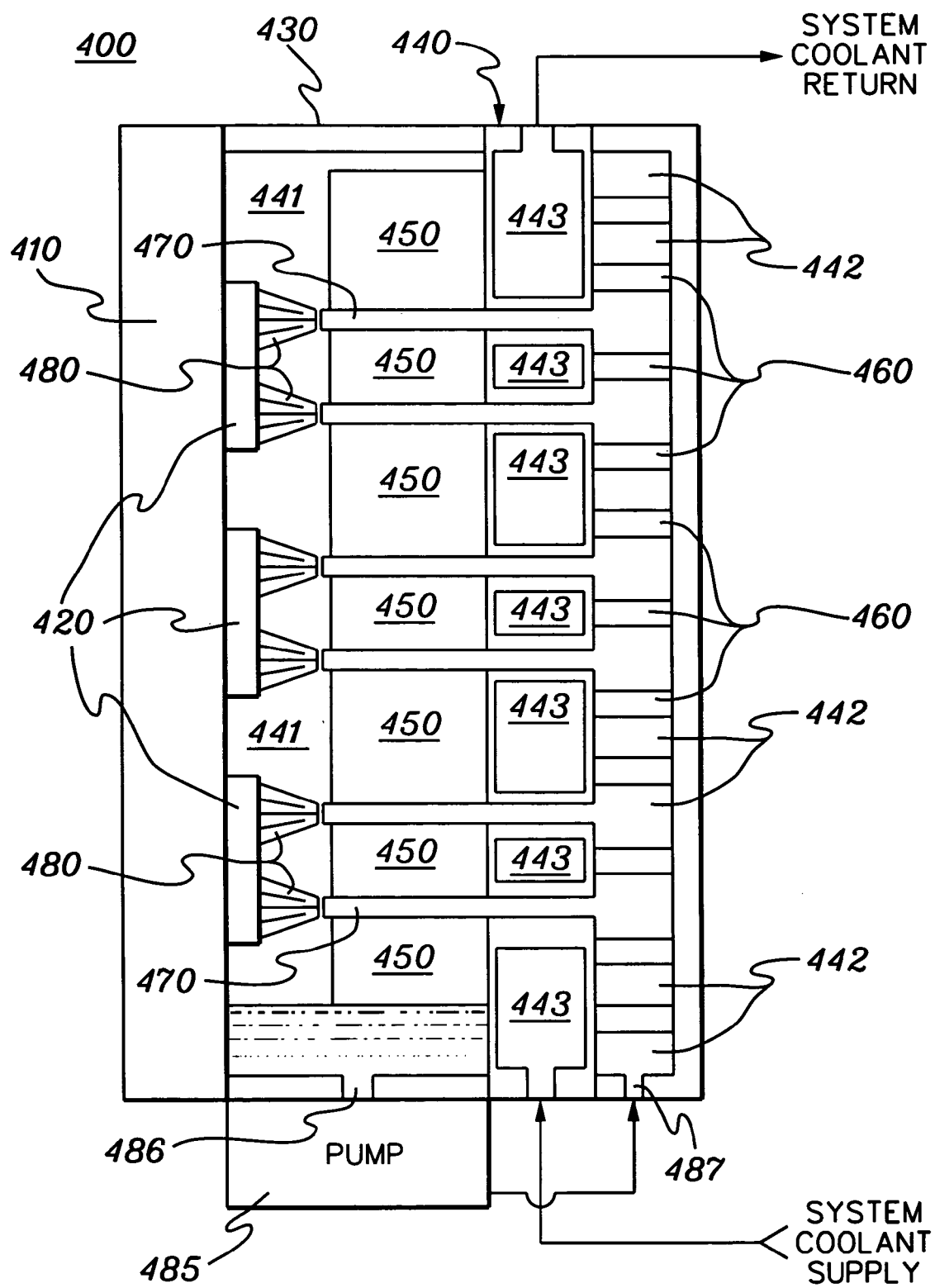
FIG. 4 is a cross-sectional view of one embodiment of a cooled electronics module with an integrated cooling apparatus, in accordance with an aspect of the present invention.
Figure 5:
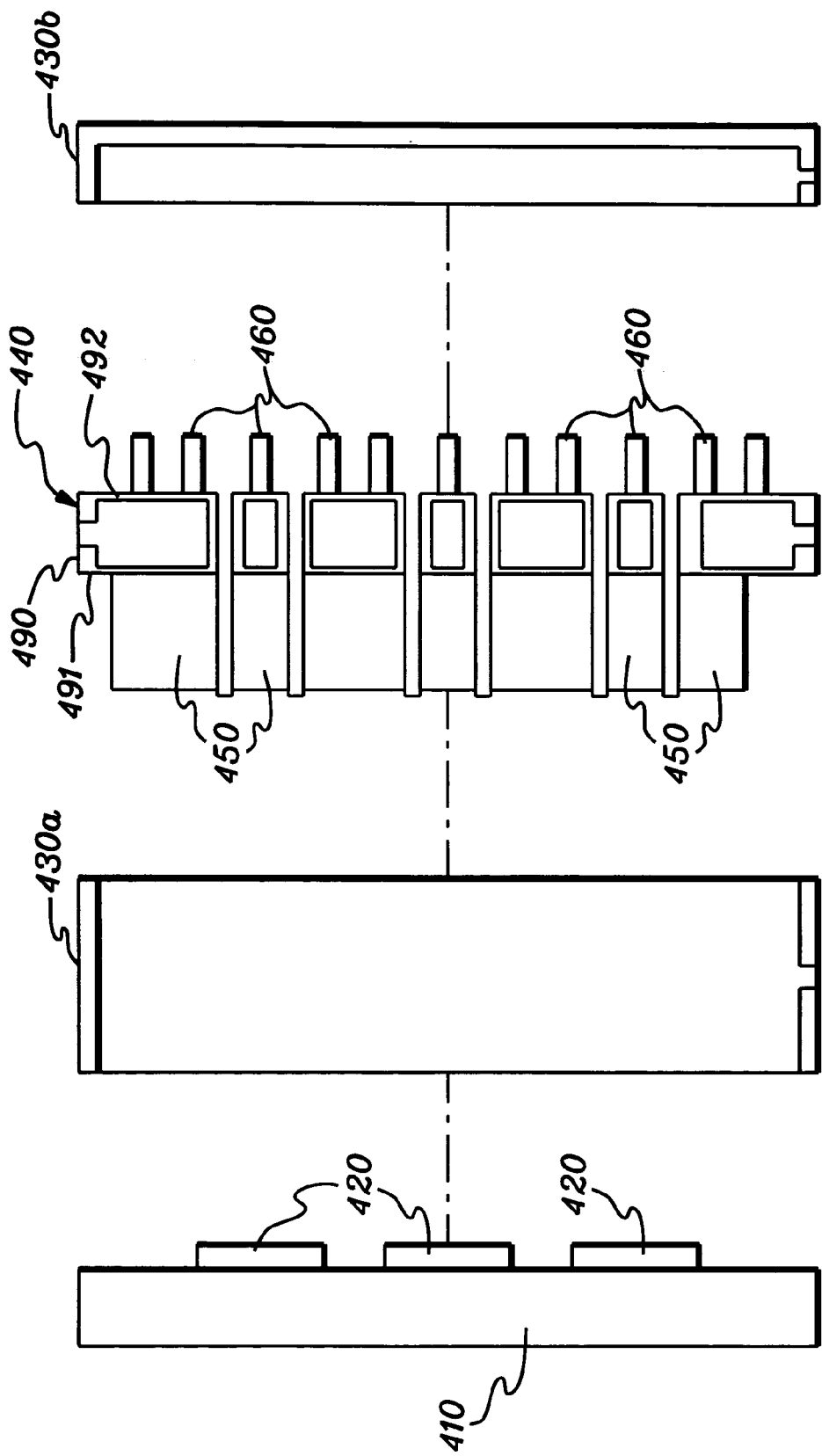
FIG. 5 is an exploded view of the cooled electronics module of FIG. 4, in accordance with an aspect of the present invention.

FIGS. 4 & 5 depict one embodiment of a cooled electronics module, generally denoted 400, in accordance with an aspect of the present invention. The electronics assembly of this cooled electronics module 400 includes a substrate 410 supporting a plurality of electronic devices 420, such as integrated circuit chips. The cooling apparatus includes an enclosure 430, which comprises a sidewall enclosure portion 430a and a cover enclosure portion 430b as shown in the exploded view of FIG. 5. The cooling apparatus further includes a heat exchange assembly 440, which in this embodiment is assumed to comprise a unitary structure comprising a cooling structure 490 having a first plate 491 and a second plate 492. A plurality of fins 450 project from a surface of first plate 491 and a plurality of fins 460 project from a surface of second plate 492 as shown. In the embodiment depicted, fins 450 comprise plate fins, while fins 460 comprise pin fins, however, those skilled in the art will recognize that fins 450 and 460 could each comprise various configurations of, e.g., plate fins and pin fins, without departing from the scope of the present invention.

When assembled as shown in FIG. 4, a first chamber 441 is defined by heat exchange assembly 440, enclosure 430 and substrate 410, a second chamber 442 is defined by heat exchange assembly 440 and enclosure 430, and a third chamber 443 is defined within cooling structure 490 of heat exchange assembly 440. First chamber 441 and second chamber 442 are in fluid communication via a plurality of channels 470, and together form a primary coolant flow path through which primary coolant is circulated via pump 485. Chamber 443 is part of a secondary coolant flow path through which, in one example, system coolant flows provided, e.g., from a coolant distribution unit such as depicted in FIGS. 1–3.

A first heat exchange or first thermal conduction path is presented between primary coolant in first chamber 441 of the primary coolant flow path and secondary coolant in third chamber 443 of the secondary coolant flow path via fins 450 and first plate 491, while a second heat exchange or second thermal conduction path is provided between primary coolant in third chamber 442 of the primary coolant flow path and secondary coolant in third chamber 443 of the secondary coolant flow path via fins 460 and second plate 492. In one embodiment, the primary coolant comprises water and the plurality of channels 470 include a plurality of spray or jet nozzles oriented to spray or impinge water onto surfaces of, or a thermally conductive surface coupled to, the plurality of electronic devices 420. In one embodiment, this water vaporizes when heated by the plurality of electronic devices, and the plurality of fins 450 function as condenser fins (e.g., condenser pins) which extract heat from the water vapor and allow the water vapor to condense, which then drops as coolant condensate into a lower portion of the cooled electronics module for pumping 485 back to second chamber 442 for return via the plurality of channels 470 as a spray or jet stream directed towards the plurality of electronics devices. In one embodiment, pump 485 comprises a miniature pump, such as a piezoelectric pump, that is attached to a lower most sidewall of enclosure structure 430. An inlet port for pump 485 connects to a coolant outlet port 486 at the lower sidewall structure of the cooled electronics module, and an outlet port of pump 485 is connected to an inlet port 487 on the lower sidewall structure of the enclosure.

In the embodiment of FIGS. 4 & 5, the integrated cooling apparatus includes three sections, with the enclosure 430 being divided into open ended sidewall enclosure 430a and cover enclosure 430b. The heat exchange assembly 440 in this example comprises a unitary structure and has a middle section 490 similar to a cold plate structure with a chamber 443 through which the secondary cooling water is passed. The heat transfer fins project outwardly from either side of the cooling structure 490; and passing through the cooling structure are channels. Coolant nozzles are associated with the channels for directing coolant, e.g., spray droplets, onto a surface of, or a surface coupled to, each electronics device. Liquid barriers (not shown) of the type disclosed in the initially incorporated patent application entitled, "Electronic Device Substrate Assembly with Multi-Layer Impermeable Barrier and Method of Making" ensure that water spray contacts, for example, only an upper, exposed integrated circuit chip surface.

During fabrication, the cooled electronics module is assumed to be evacuated at the factory and partially back-filled with a primary coolant liquid, such as water. In one embodiment, the amount of water charge added is sufficient that during operation, liquid is situated above and in the pump, as well as in primary coolant passages of the integrated heat exchange assembly, but not so as to cover the electronic devices themselves. In operation, secondary coolant is passed through the cooling structure portion of the heat exchange assembly to cool and remove heat from the fins on either side of the heat exchange assembly and transport the heat away from the module. The miniature pump delivers the primary coolant to the passages formed between the fins on the right side of the integrated heat assembly and the cover enclosure portion. This primary coolant in the second chamber 442 is sub-cooled further below saturation temperature by fins 460 before flowing back through the coolant nozzles. Coolant exiting, e.g., as spray droplets impinges on a surface thermally coupled to the electronic devices or on an exposed surface of the electronic devices themselves. This impinging spray is vaporized at a temperature well below the normal boiling point of water due to the provision of sub-atmospheric pressure within the primary coolant flow path of the cooling apparatus. The resulting vapor is condensed on the condensing fins 450 projecting outward from first plate 491 of the integrated heat exchange assembly. The condensed liquid falls into the sump situated immediately above the inlet to the pump, thereby completing the heat exchange cycle and the flow of the primary coolant through the primary coolant flow path. In the event of failure, the entire cooled electronics module assembly can be removed and repaired or replaced.

Figure 6:
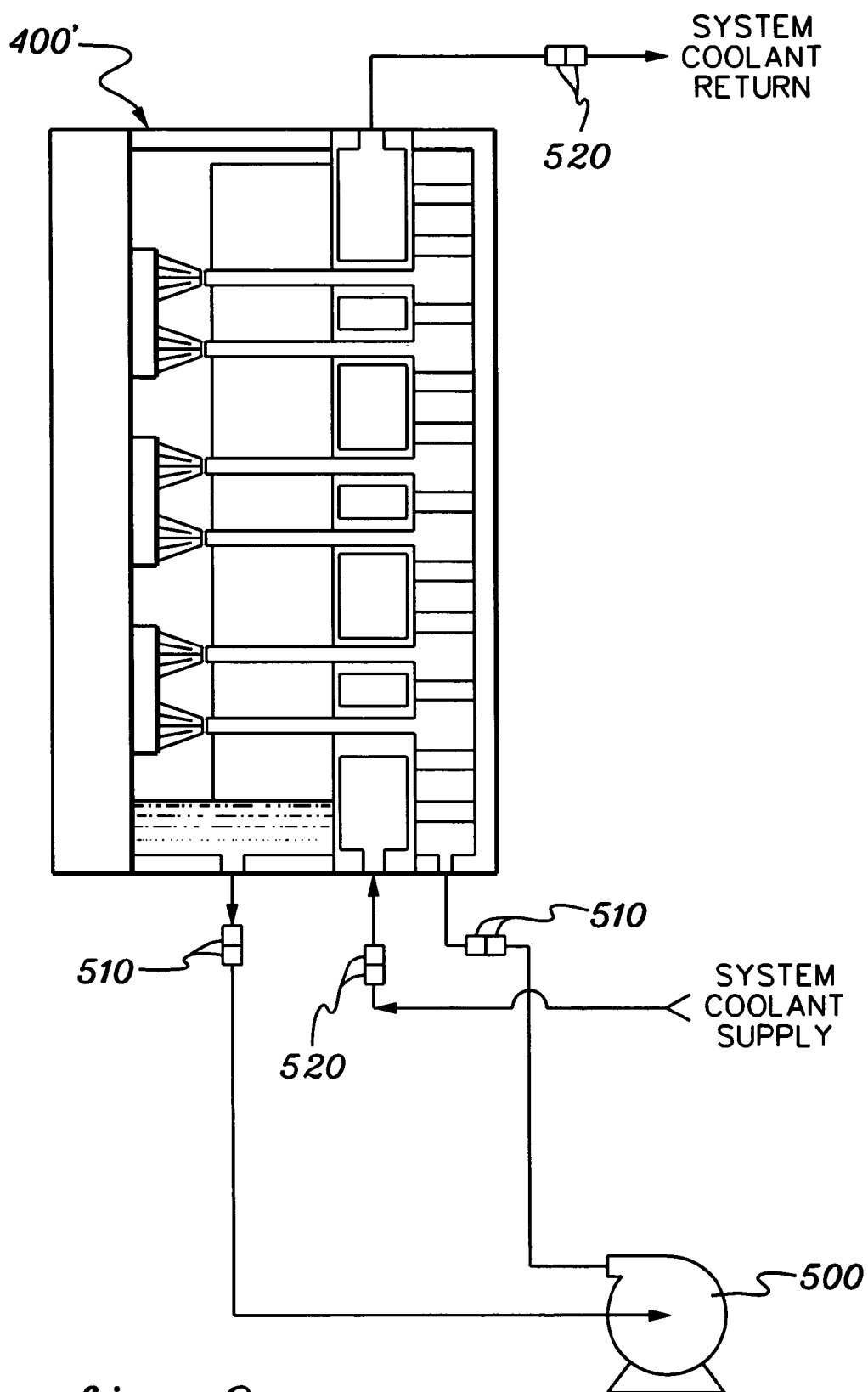
FIG. 6 depicts an alternate embodiment of a cooled electronics module with an integrated cooling apparatus, in accordance with an aspect of the present invention.

FIG. 6 depicts an alternate embodiment of a cooled electronics module, generally denoted 400', in accordance with an aspect of the present invention. In this embodiment, a pump 500, which may again comprise a miniature pump, is located separately from the cooled module itself. A mechanism such as connect/disconnect couplings 510 can be provided for connecting and disconnecting pump 500 from the cooled module assembly. Similar connect/disconnect couplings 520 may also be employed in the secondary coolant flow path containing, for example, system coolant.

In still another embodiment, primary coolant passages of the cooling apparatus could be substantially filled with primary coolant, with only a small vapor pocket being provided within the primary coolant flow path for liquid expansion. In this embodiment, primary coolant surrounds the electronics devices supported by the substrate, and instead of a spray, immersed liquid jets may be used to cool the electronics devices. The cooling apparatus would be operated in a single phase regime, which would not require the maintenance of sub-atmospheric pressure conditions within the module. The fins projecting from both sides of the cooling structure would operate in the single phase convection heat transfer regime to transfer heat from the primary coolant to the secondary coolant. In this mode, the cooling apparatus and cooled electronics module could be disposed in any desired orientation from horizontal to vertical.

Figure 7A:
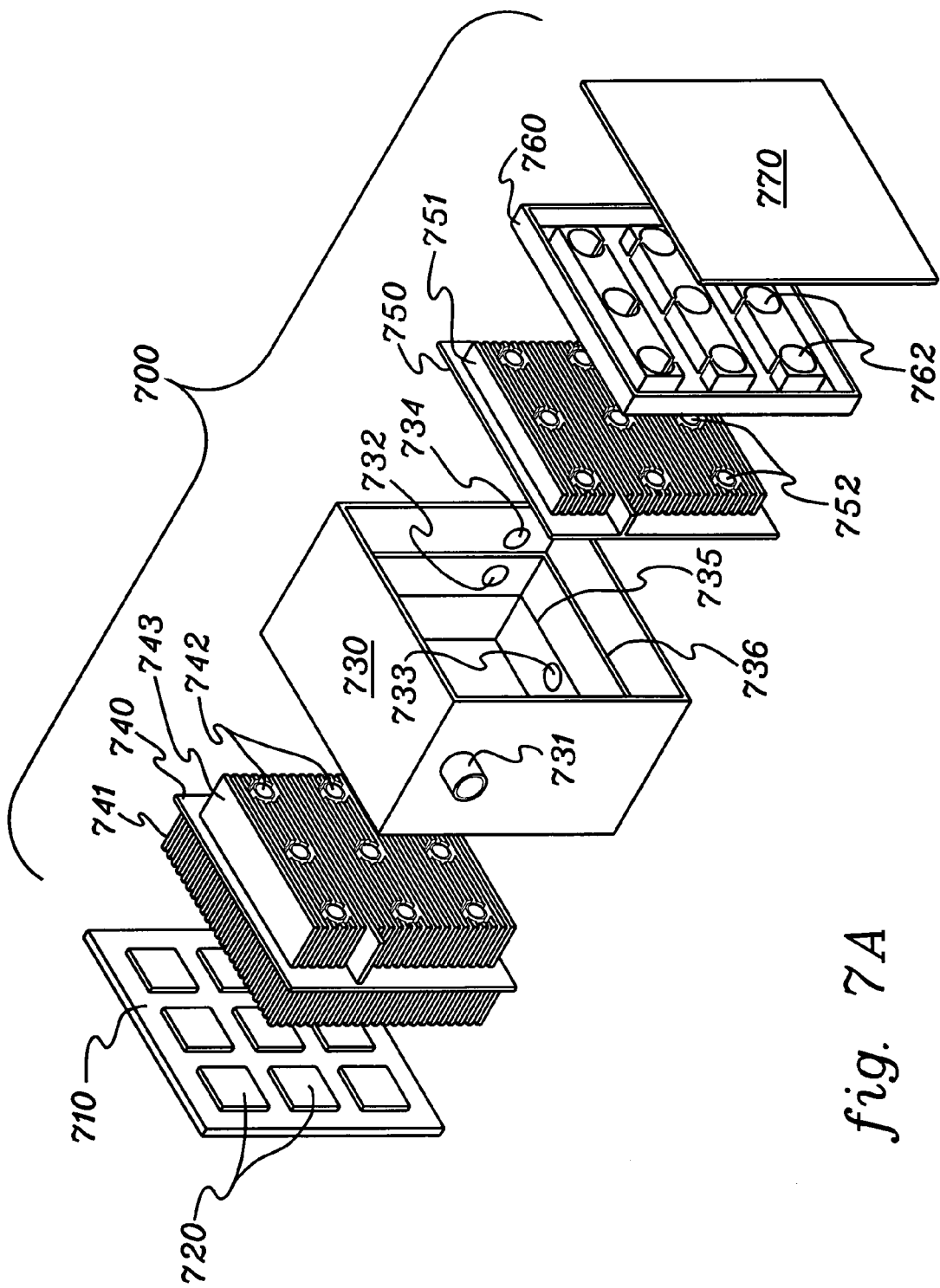
FIG. 7A is an exploded isometric view of another embodiment of a cooled electronics module employing an integrated cooling apparatus, in accordance with an aspect of the present invention.

FIGS. 7A–9B depict a further embodiment of a cooling apparatus wherein the heat exchange assembly is integrated within the module, in accordance with an aspect of the present invention. Referring first to FIGS. 7A & 7B, the cooled electronics module 700 includes a substrate 710 which supports a plurality of electronic devices 720, such as integrated circuit chips. An enclosure 730 is sized with a perimeter region for sealably engaging substrate 710 to form a cavity containing the plurality of electronic devices 720. The integrated heat exchange assembly in this embodiment includes a first plate structure 740 and a second plate structure 750, both of which are brazed to respective seats 735, 736 formed by a raised portion around the inner surface of enclosure 730. These brazed plates and seats form a coolant-tight seal. A top plate structure 760 resides atop second plate structure 750 and a cover enclosure 770 seals top plate structure 760.

When sealed as noted above, a first chamber is defined between first plate structure 740, enclosure 730 and substrate 710 and a second chamber is formed between second plate structure 750, enclosure 730 and top plate structure 760, while a third chamber is defined between first plate structure 740, enclosure 730 and second plate structure 750. As explained further below, the first chamber and the second chamber are part of a primary coolant flow path, while the third chamber is part of a secondary coolant flow path.

Figure 7B:
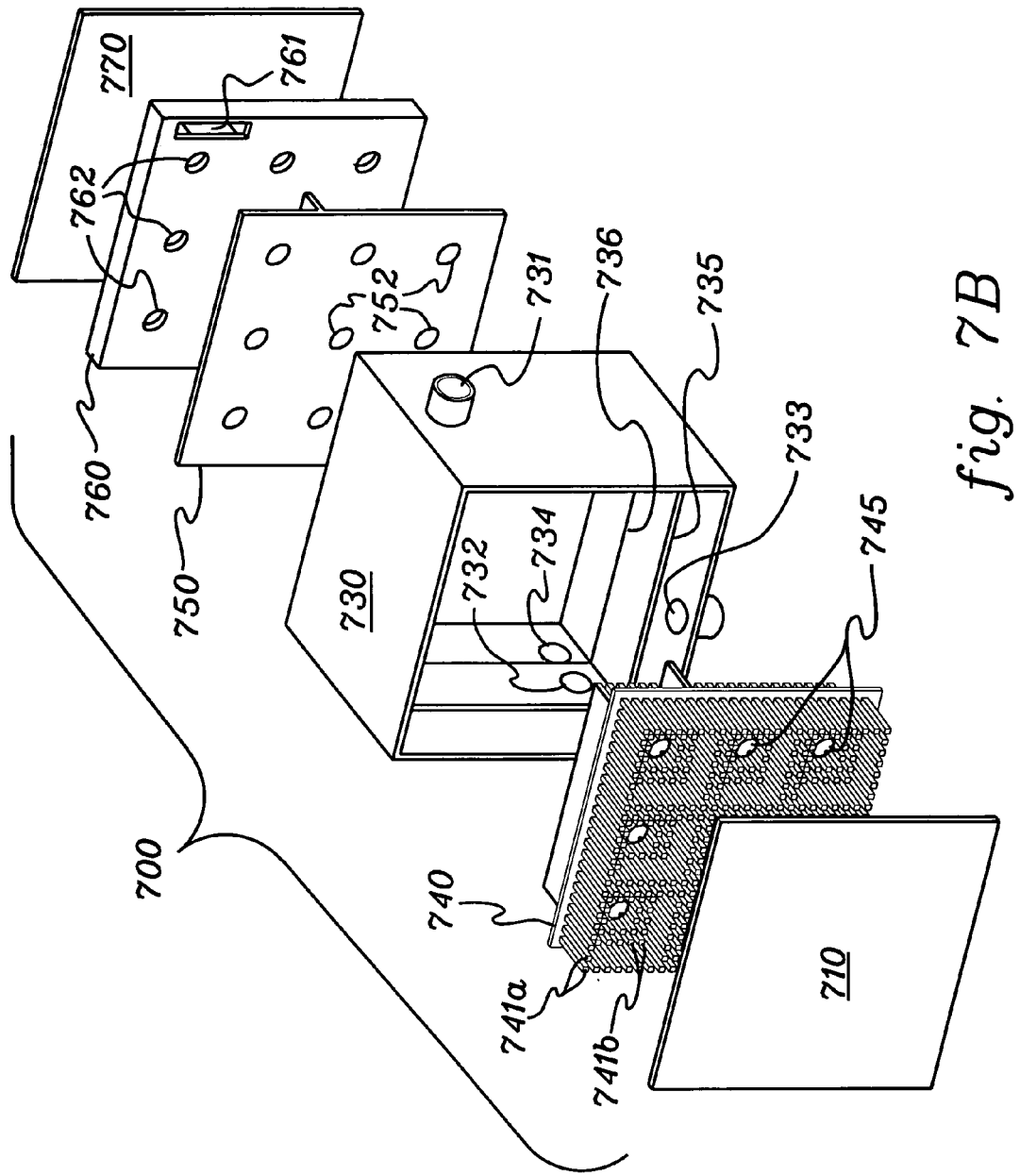
FIG. 7B depicts an alternate, exploded isometric view of the cooled electronics module with integrated cooling apparatus of FIG. 7A, in accordance with an aspect of the present invention.
Figure 8A:
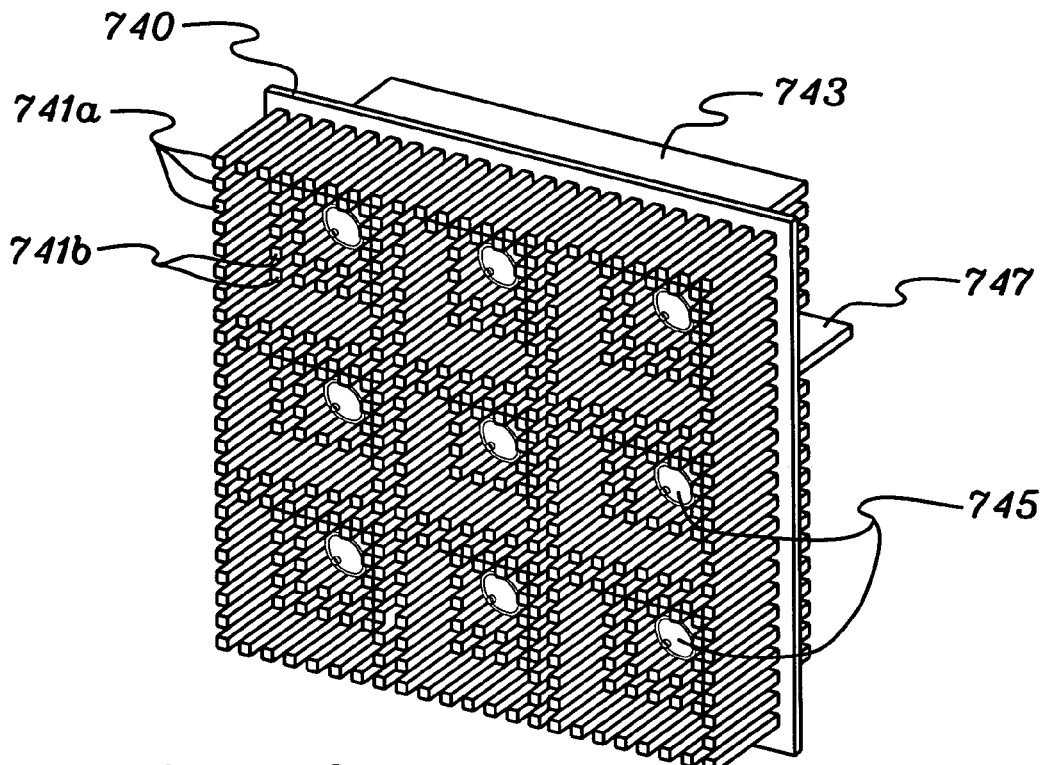
FIG. 8A is a more detailed, isometric view of first plate 740 of the cooling apparatus of FIGS. 7A & 7B, showing first and second plurality of condenser fins extending from a main surface thereof, in accordance with an aspect of the present invention.
Figure 8B:
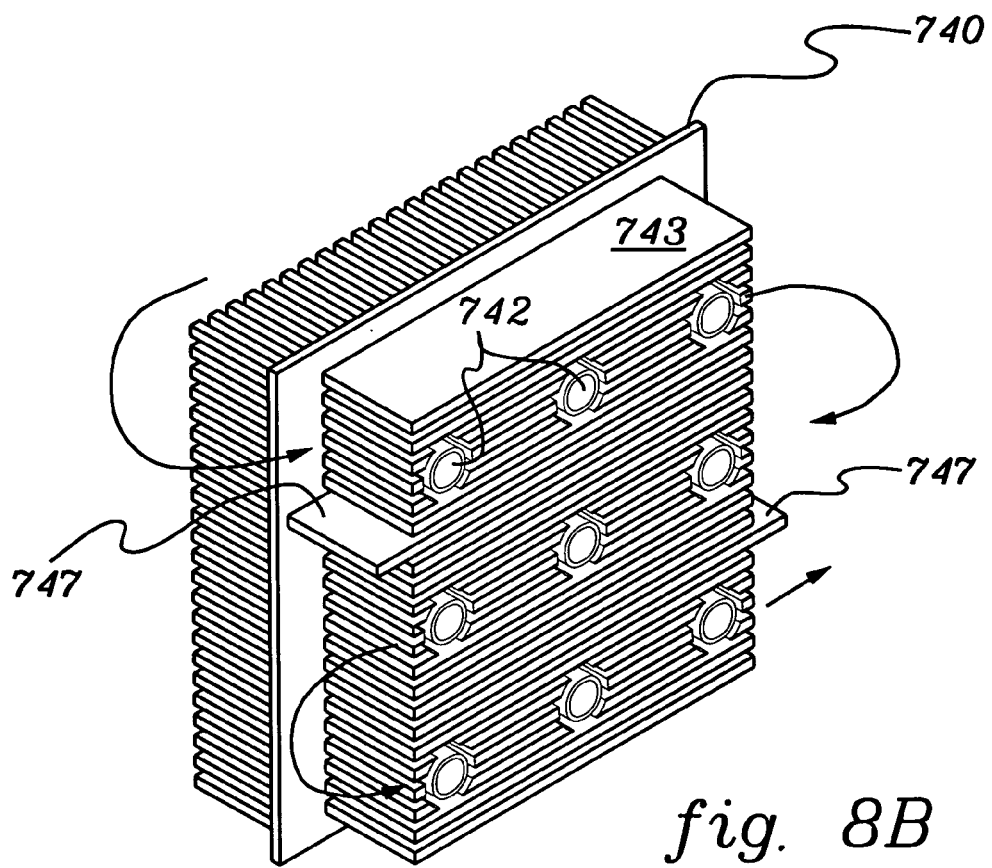
FIG. 8B depicts the first plate of FIG. 8A showing a plurality of fins extending from an opposite main surface thereof, in accordance with an aspect of the present invention.

FIGS. 8A & 8B depict in greater detail the embodiment of first plate structure 740 depicted in FIGS. 7A & 7B. As shown in FIG. 8A, first plate structure 740 includes a first plurality of fins 741a and a second plurality of fins 741b projecting from a surface thereof and extending within the first chamber formed between first plate structure 740, enclosure 730 and substrate 710. In the example depicted, these pluralities of fins 741a & 741b comprise pin fins, with the second plurality of fins 741b being disposed adjacent to respective spray nozzles 745 projecting from first plate structure 740. As noted above, primary coolant is provided, in one embodiment, as spray droplets positioned to impinge upon respective electronic device surfaces 720. The second plurality of fins 741b are of shorter length than the first plurality of fins 741a so as not to interfere with a cone-shaped spray pattern emitted by spray nozzle 745 when in use. When employed with a phase changing primary coolant, fins 741a & 741b comprise condenser fins upon which vapor condenses and through which heat is transferred to first plate structure 740, and hence to the secondary coolant flowing through the secondary coolant flow path within the third chamber defined between first plate structure 740 and second plate structure 750.

The opposite surface of first plate structure 740 also has a plurality of fins 743 projecting therefrom, which in one embodiment, comprise plate fins. Secondary coolant flow through plate fins 743 is facilitated by providing two extended plate fins 747 which function as flow baffle fins to direct secondary coolant to flow through the third chamber as shown by the arrows in FIG. 8B. Referring to FIGS. 7A, 7B & 8B, secondary coolant enters into the third chamber through coolant inlet 731 in enclosure 730 and passes through plate fins 743 in a serpentine manner as shown, where heat is extracted from a first thermal conduction path defined by the plurality of fins 741a, 741b and first plate structure 740, and from a second thermal conduction path defined by fins 751 and second plate structure 750. In one example, fins 741a, 741b comprise condenser pins, i.e., assuming that sub-atmospheric pressure is maintained within the enclosure and the primary coolant is a phase change material, while fins 751 are sub-cooling fins for cooling the primary coolant further below saturation temperature. A plurality of channels 742 pass through the first plate structure 740, at one end of which are disposed coolant nozzles 745. Channels 742 align with channels 752 in second plate structure 750 and channels 762 in top plate structure 760. When structures 740, 750 and 760 are brazed together, respective channels 742, 752 & 762 align to form continuous fluid paths from inlets in top plate 760 to the respective coolant nozzle 745 of first plate structure 740.

Figure 9A:
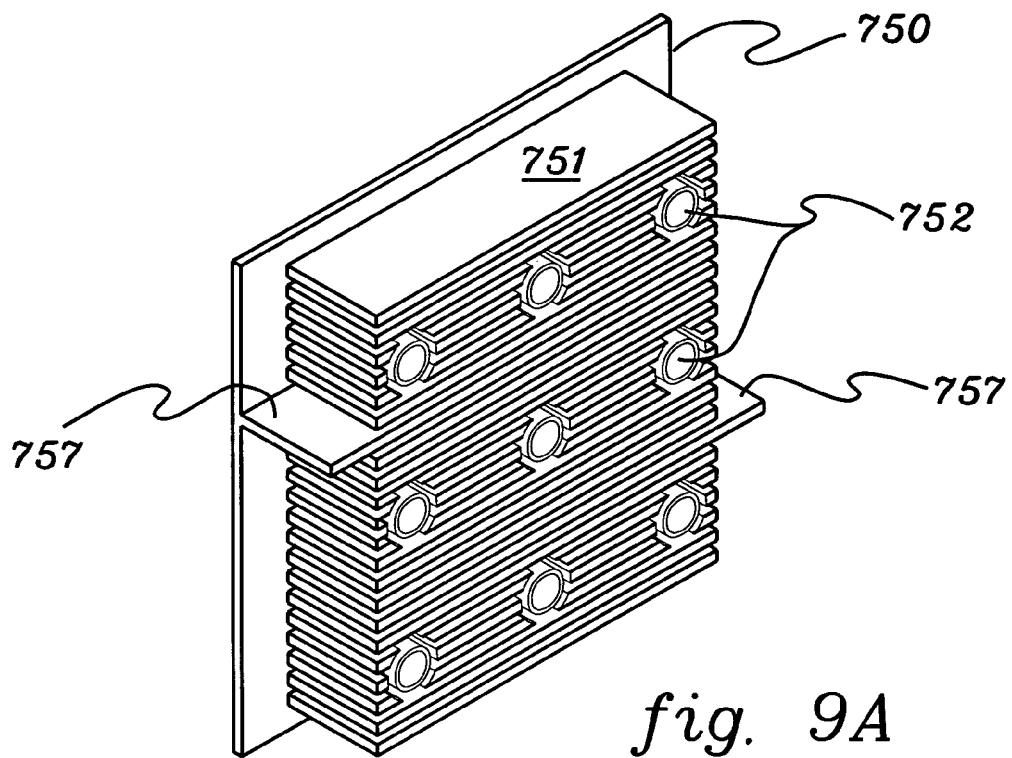
FIG. 9A is a more detailed, isometric view of the second plate 750 of the cooling apparatus of FIGS. 7A & 7B, showing a plurality of fins projecting from a main surface thereof, in accordance with an aspect of the present invention.
Figure 9B:
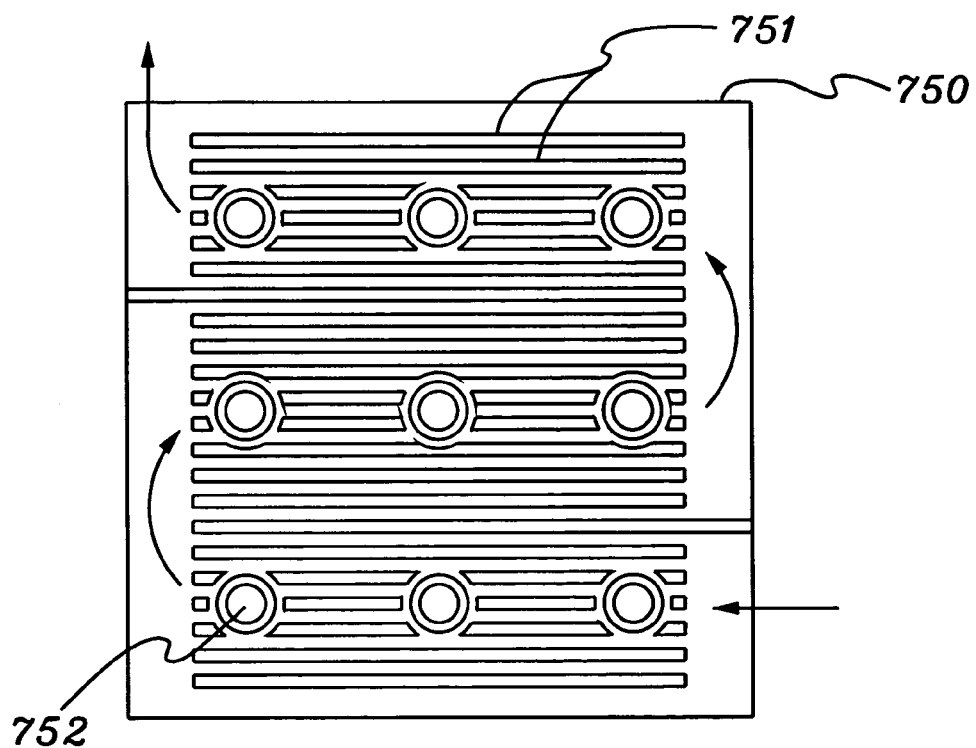
FIG. 9B is a plan view of the second plate 750 of FIG. 9A, showing primary coolant flow through the plurality of fins, in accordance with an aspect of the present invention.

Second-plate structure 750 is depicted in greater detail in FIGS. 9A & 9B. As shown, this plate structure includes a plurality of plate fins 751 which project from a main surface thereof. Two flow baffle fins 757 are provided extending to an inner surface of enclosure 730 when the integrated heat exchange assembly is brazed together within the enclosure. These baffles 757 direct primary coolant flow through the plate fins 751 as shown in FIG. 9B. Referring to FIGS. 7A & 7B, an inlet 734 in a side of enclosure 730 delivers primary coolant to the chamber formed between second plate structure 750 and top plate structure 760. This coolant flows in a serpentine manner through the plate fins and exits through an opening 761 (see FIG. 7B) into the delivery chamber defined by structure 760, enclosure 730 and cover enclosure 770 for passage down through the aligned channels 762, 752, 742 for delivery to respective coolant nozzles.

Although presented herein principally as spray nozzles, these coolant nozzles 745 could alternatively comprise jet nozzles. Both spray and jet nozzles could be employed with a phase changing primary coolant material. The cooled electronics module further includes a pump (not shown), either integrated with enclosure 730 or separate therefrom, as noted above in connection with FIGS. 4–6. The pump removes primary coolant through an outlet 733 in enclosure 730 and returns the fluid through inlet 734 to the second chamber defined between second plate structure 750, enclosure 730 and top plate structure 760. As noted above, the primary coolant and secondary coolant can have one or more different characteristics such as those noted above. Advantageously, a primary coolant loop could comprise a sealed, closed loop fluid path, which is not intend to be opened in the field once the electronics module assembly has been set up. This allows the primary coolant to have substantially greater purity than the secondary coolant passing through the secondary coolant flow path.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus for an electronics assembly comprising a substrate and at least one heat generating electronics device, the cooling apparatus comprising:

an enclosure having a perimeter region for sealably engaging the substrate to form a cavity, the at least one heat generating electronics device being disposed within the cavity defined by the substrate and the enclosure;

a heat exchange assembly disposed within the enclosure, the heat exchange assembly defining a primary coolant flow path and a separate, secondary coolant flow path, wherein the primary coolant flow path comprises a first chamber and a second chamber, the first chamber and the second chamber being in fluid communication, and wherein the secondary coolant flow path comprises a third chamber disposed between the first chamber and the second chamber of the primary coolant flow path, and wherein the heat exchange assembly provides a first thermal conduction path between primary coolant in the first chamber of the primary coolant flow path and secondary coolant in the third chamber of the secondary coolant flow path, and a second thermal conduction path between primary coolant in the second chamber of the primary coolant flow path and secondary coolant in the third chamber of the secondary coolant flow path; and wherein the heat exchange assembly further comprises at least one coolant nozzle associated with the first chamber of the primary coolant flow path, the at least one coolant nozzle directing primary coolant towards a surface of the at least one heat generating electronics device.

2. The cooling apparatus of claim 1, wherein at least a portion of the primary coolant within the first chamber vaporizes from heat generated by the at least one heat generating electronics device, and wherein the heat exchange assembly further includes condenser fins disposed within the first chamber of the primary coolant flow path for condensing vaporized primary coolant, the first thermal conduction path comprising the condenser fins.

3. The cooling apparatus of claim 2, wherein the second chamber includes sub-cooling fins for cooling the primary coolant further below saturation temperature, the second thermal conduction path comprising the sub-cooling fins.

4. The cooling apparatus of claim 2, wherein the heat exchange assembly further comprises a plurality of channels passing through the third chamber and allowing primary coolant from the second chamber to flow into the first chamber of the primary coolant flow path, and wherein each channel includes a coolant nozzle at an end thereof projecting within the first chamber of the primary coolant path, each coolant nozzle comprises one of a spray nozzle or a jet nozzle.

5. The cooling apparatus of claim 4, wherein the condenser fins comprise a first plurality of condenser pins and a second plurality of condenser pins, the second plurality of condenser pins being longer than the first plurality of condenser pins, and wherein the first plurality of condenser pins are arrayed within the first chamber closer to the coolant nozzles at the ends of the plurality of channels than the second plurality of condenser pins.

6. The cooling apparatus of claim 1, further comprising a pump for causing said primary coolant to flow through said primary coolant flow path from the first chamber to the second chamber, and then back to the first chamber through the at least one coolant nozzle.

7. The cooling apparatus of claim 6, wherein the pump causes the primary coolant to flow through a path partially external to the enclosure.

8. The cooling apparatus of claim 1, wherein primary coolant within the first chamber of the primary coolant flow path is at sub-atmospheric pressure, and at least a portion of the primary coolant within the first chamber vaporizes from heat generated by the at least one heat generating electronics device, and wherein the first thermal conduction path of the heat exchange assembly facilitates condensing of vaporized primary coolant within the first chamber, and the second thermal conduction path of the heat exchange assembly facilitates cooling of the primary coolant in the second chamber further below saturation temperature.

9. The cooling apparatus of claim 1, wherein the primary coolant and the secondary coolant differ by at least one characteristic, the at least one characteristic comprising at least one of: coolant purity; coolant pressure; coolant flow rate; coolant phase change temperature; and coolant chemistry.

10. The cooling apparatus of claim 1, wherein the electronics assembly includes a plurality of integrated circuit chips supported by the substrate, and wherein the heat exchange assembly further comprises a plurality of coolant nozzles, each coolant nozzle projecting within the first chamber of the primary coolant flow path and directing primary coolant towards a respective one of the plurality of integrated circuit chips supported by the substrate of the electronics assembly.

11. The cooling apparatus of claim 10, wherein primary coolant substantially fills the first chamber of the primary coolant flow path.

12. The cooling apparatus of claim 10, wherein at least a portion of the primary coolant within the first chamber vaporizes from heat generated by the plurality of integrated circuit chips, and wherein the heat exchange assembly further includes condenser fins disposed within the first chamber of the primary coolant flow path for condensing vaporized primary coolant, the first thermal conduction path comprising the condenser fins.

13. The cooling apparatus of claim 12, further comprising a pump coupled to the enclosure, and wherein a high thermal conductivity fluid barrier at least partially protects the plurality of integrated circuit chips from primary coolant within the first chamber of the primary coolant flow path.

14. The cooling apparatus of claim 1, wherein the first thermal conduction path of the heat exchange assembly comprises a first plurality of high thermal conductivity fins in thermal communication with primary coolant within the first chamber of the primary coolant flow path, and wherein the second thermal conduction path includes a second plurality of high thermal conductivity fins in thermal communication with primary coolant in the second chamber of the primary coolant flow path.

15. The cooling apparatus of claim 14, wherein the heat exchange assembly further comprises a third plurality of high thermal conductivity fins in thermal communication with the secondary coolant in the third chamber of the secondary coolant flow path, and wherein the first thermal conduction path of the heat exchange assembly further comprises the third plurality of high thermal conductivity fins, and the second thermal conduction path also includes the third plurality of high thermal conductivity fins.

16. The cooling apparatus of claim 1, wherein the heat exchange assembly comprises a micro-scaled cooling structure having a first plate and a second plate, wherein the third chamber of the secondary coolant flow path is disposed within the micro-scaled cooling structure between the first plate and the second plate, and wherein the first thermal conduction path includes the first plate of the micro-scaled cooling structure and the second thermal conduction path includes the second plate of the micro-scaled cooling structure.

17. The cooling apparatus of claim 1, wherein the electronics assembly and cooling apparatus form an electronics module assembly for an electronics subsystem of an electronics rack, the primary coolant comprises a conditioned coolant, and the secondary coolant comprises system coolant provided by a coolant distribution unit for cooling the electronics subsystem, and wherein the conditioned coolant and the system coolant differ by at least one characteristic, the at least one characteristic comprising at least one of: coolant purity; coolant pressure; coolant flow rate; coolant phase change temperature; and coolant chemistry.

18. A cooled electronics module comprising:
a substrate and at least one heat generating electronics device attached thereto; and
a cooling apparatus for cooling the at least one heat generating electronics device, the cooling apparatus comprising:
an enclosure having a perimeter region for sealably engaging the substrate to form a cavity, the at least one heat generating electronics device being disposed within the cavity defined by the substrate and the enclosure;
a heat exchange assembly disposed within the enclosure, the heat exchange assembly defining a primary coolant flow path and a separate, secondary coolant flow path, wherein the primary coolant flow path comprises a first chamber and a second chamber, the first chamber and the second chamber being in fluid communication, and wherein the secondary coolant flow path comprises a third chamber disposed between the first chamber and the second chamber of the primary coolant flow path, and wherein the heat exchange assembly provides a first thermal conduction path between primary coolant in the first chamber of the primary coolant flow path and secondary coolant in the third chamber of the secondary coolant flow path, and a second thermal conduction path between primary coolant in the second chamber of the primary coolant flow path and secondary coolant in the third chamber of the secondary coolant flow path; and
wherein the heat exchange assembly further comprises at least one coolant nozzle associated with the first chamber of the primary coolant flow path, the at least one coolant nozzle directing primary coolant towards a surface of the at least one heat generating electronics device.

19. The cooled electronics module of claim 18, wherein at least a portion of the primary coolant within the first chamber vaporizes from heat generated by the at least one heat generating electronics device, and wherein the heat exchange assembly further includes condenser fins disposed within the first chamber of the primary coolant flow path for condensing vaporized primary coolant, the first thermal conduction path comprising the condenser fins.

20. The cooled electronics module of claim 19, wherein the second chamber includes sub-cooling fins for cooling the primary coolant further below saturation temperature, the second thermal conduction path comprising the sub-cooling fins.

21. The cooled electronics module of claim 19, wherein the heat exchange assembly further comprises a plurality of channels passing through the third chamber and allowing primary coolant from the second chamber to flow into the first chamber of the primary coolant flow path, and wherein each channel includes a coolant nozzle at an end thereof projecting within the first chamber of the primary coolant path, each coolant nozzle comprises one of a spray nozzle or a jet nozzle.

22. The cooled electronics module of claim 21, wherein the condenser fins comprise a first plurality of condenser pins and a second plurality of condenser pins, the second plurality of condenser pins being longer than the first plurality of condenser pins, and wherein the first plurality of condenser pins are arrayed within the first chamber closer to the coolant nozzles at the ends of the plurality of channels than the second plurality of condenser pins.

23. The cooled electronics module of claim 18, further comprising a pump for causing said primary coolant to flow through said primary coolant flow path from the first chamber to the second chamber, and then back to the first chamber through the at least one coolant nozzle, and wherein the pump causes the primary coolant to flow through a path partially external to the enclosure.

24. The cooled electronics module of claim 18, wherein primary coolant within the first chamber of the primary coolant flow path is at sub-atmospheric pressure, and wherein at least a portion of the primary coolant within the first chamber vaporizes from heat generated by the at least one heat generating electronics device, and wherein the first thermal conduction path of the heat exchange assembly facilitates condensing of vaporized primary coolant within the first chamber, and the second thermal conduction path of the heat exchange assembly facilitates cooling of the primary coolant in the second chamber further below saturation temperature.

25. The cooled electronics module of claim 18, wherein the primary coolant and the secondary coolant differ by at least one characteristic, the at least one characteristic comprising at least one of: coolant purity; coolant pressure; coolant flow rate; coolant phase change temperature; and coolant chemistry.

26. The cooled electronics module of claim 18, wherein the electronics assembly includes a plurality of integrated circuit chips supported by the substrate, and wherein the heat exchange assembly further comprises a plurality of coolant nozzles, each coolant nozzle projecting within the first chamber of the primary coolant flow path and directing primary coolant towards a respective one of the plurality of integrated circuit chips supported by the substrate of the electronics assembly.

27. The cooled electronics module of claim 26, wherein at least a portion of the primary coolant within the first chamber vaporizes from heat generated by the plurality of integrated circuit chips, and wherein the heat exchange assembly further includes condenser fins disposed within the first chamber of the primary coolant flow path for condensing vaporized primary coolant, the first thermal conduction path comprising the condenser fins.

28. The cooled electronics module of claim 26, wherein primary coolant substantially fills the first chamber of the primary coolant flow path.

29. The cooled electronics module of claim 18, wherein the first thermal conduction path of the heat exchange assembly comprises a first plurality of high thermal conductivity fins in thermal communication with primary coolant within the first chamber of the primary coolant flow path, and wherein the second thermal conduction path includes a second plurality of high thermal conductivity fins in thermal communication with primary coolant in the second chamber of the primary coolant flow path.

30. The cooled electronics module of claim 29, wherein the heat exchange assembly further comprises a third plurality of high thermal conductivity fins in thermal communication with the secondary coolant in the third chamber of the secondary coolant flow path, and wherein the first thermal conduction path of the heat exchange assembly further comprises the third plurality of high thermal conductivity fins, and the second thermal conduction path also includes the third plurality of high thermal conductivity fins.

31. The cooled electronics module of claim 18, wherein the heat exchange assembly comprises a micro-scaled cooling structure having a first plate and a second plate, wherein the third chamber of the secondary coolant flow path is disposed within the micro-scaled cooling structure between the first plate and the second plate, and wherein the first thermal conduction path includes the first plate of the micro-scaled cooling structure and the second thermal conduction path includes the second plate of the micro-scaled cooling structure.

32. The cooled electronics module of claim 18, wherein the cooled electronics module is part of an electronics subsystem of an electronics rack, the primary coolant comprises a conditioned coolant, and a secondary coolant comprises system coolant provided by a coolant distribution unit for cooling the electronics subsystem, and wherein the conditioned coolant and the system coolant differ by at least one characteristic, the at least one characteristic comprising at least one of: coolant purity; coolant pressure; coolant flow rate; coolant phase change temperature; and coolant chemistry.

33. A method of cooling an electronics assembly comprising a substrate and at least one heat generating electronics device, the cooling method comprising:

providing an enclosure having a perimeter region for sealably engaging the substrate to form a cavity, the at least one heat generating electronics device being disposed within the cavity defined by the substrate and the enclosure;

providing a heat exchange assembly disposed within the enclosure, the heat exchange assembly defining a primary coolant flow path and a separate, secondary coolant flow path, wherein the primary coolant flow path comprises a first chamber and a second chamber, the first chamber and the second chamber being in fluid communication, and wherein the secondary coolant flow path comprises a third chamber disposed between the first chamber and the second chamber of the primary coolant flow path, and wherein the heat exchange assembly comprises a first thermal conduction path between primary coolant in the first chamber of the primary coolant flow path and secondary coolant in the third chamber of the secondary coolant flow path, and a second thermal conduction path between primary coolant in the second chamber of the primary coolant flow path and secondary coolant in the third chamber of the secondary coolant flow path, and wherein the heat exchange assembly further comprises at least one coolant nozzle associated with the first chamber of the primary coolant flow path, the at least one coolant nozzle directing primary coolant towards a surface of the at least one heat generating electronics device; and pumping primary coolant through the primary coolant flow path and separately pumping secondary coolant through the secondary coolant flow path.

* * * * *